US 6,566,628 B2

(12) United States Patent
Vogt et al.

(10) Patent No.: US 6,566,628 B2
(45) Date of Patent: May 20, 2003

(54) METHOD AND DEVICE FOR THIN-FILM ABLATION OF A SUBSTRATE

(75) Inventors: Helmut Vogt, Munich (DE); Franz Karg, Munich (DE)

(73) Assignee: Siemens and Shell Solar GmbH (NL)

( * ) Notice: Subject to any disclaimer, the term of this patent is extended or adjusted under 35 U.S.C. 154(b) by 0 days.

(21) Appl. No.: 09/972,491

(22) Filed: Oct. 5, 2001

(65) Prior Publication Data

US 2002/0074318 A1 Jun. 20, 2002

Related U.S. Application Data

(63) Continuation of application No. PCT/EP00/03132, filed on Apr. 7, 2000.

(30) Foreign Application Priority Data

Apr. 7, 1999 (DE) .......................... 199 15 640
Jun. 16, 1999 (DE) .......................... 199 27 529
Jul. 19, 1999 (DE) .......................... 199 33 703

(51) Int. Cl.[7] .................. B23K 26/00; B23K 26/14; B23K 26/16; B23K 26/18
(52) U.S. Cl. .................. 219/121.69; 219/121.68; 219/121.67
(58) Field of Search ............ 219/121.69, 121.68, 219/121.67, 121.85, 121.72, 121.73

(56) References Cited

U.S. PATENT DOCUMENTS

| 4,705,698 A | 11/1987 | Van Dine |
| 4,734,550 A | 3/1988 | Imamura et al. |
| 4,806,728 A | 2/1989 | Salzer et al. |
| 5,151,135 A * | 9/1992 | Magee et al. ............ 134/1 |
| 5,296,674 A | 3/1994 | Praschek et al. |
| 6,168,968 B1 * | 1/2001 | Umemoto et al. ........... 438/96 |
| 6,292,609 B1 * | 9/2001 | Matsushima et al. ........ 385/43 |

FOREIGN PATENT DOCUMENTS

| DE | 3727825 A1 | 8/1987 |
| DE | 3705500 A1 | 9/1988 |
| DE | 3902985 A1 | 2/1989 |
| EP | 0482240 A1 | 10/1990 |
| EP | 0536431 A1 | 10/1991 |
| JP | 10052780 A | 2/1998 |
| WO | 99/10932 * | 3/1999 ........ H01L/31/032 |

OTHER PUBLICATIONS

Nakano, et al., "Laser Patterning Method for Integrated Type a–Si Solar Cell Submodules," Japanese Journal of Applied Physics, vol. 25, No. 12, Dec., 1986, pp. 1936–1943.

* cited by examiner

Primary Examiner—M. Alexandra Elve
(74) Attorney, Agent, or Firm—Wolf, Greenfield&Sacks, P.C.

(57) ABSTRACT

A method and device for thin-film ablation of a substrate of a workpiece, more particularly, for surface layer ablation of a thin-film solar cell. The device comprises a laser resonator for generating a light pulse machining beam having pulse durations smaller than 100 ns and a pulse energy density between 0.1 and 10 J/cm$^2$, and a controllable positioner for positioning the workpiece relative to the machining beam such that an amount of energy impinging the surface to be machined is substantially constant for each unit of surface area. The device further includes an optical system arranged in a path of the machining beam, including an optical fiber cable and an optical imaging member for imaging an output of the optical fiber cable on a surface of the workpiece, the optical system being configured such that, in a plane of the surface to be machined, the power distribution is substantially homogenous.

23 Claims, 3 Drawing Sheets

METHOD AND DEVICE FOR THIN-FILM ABLATION OF A SUBSTRATE

RELATED APPLICATIONS

The present invention is a continuation of International Patent Application Ser. No. PCT/EP00/03132, filed Apr. 7, 2000.

Foreign priority benefits are claimed under 35 U.S.C. §119(a)–(d) or 35 U.S.C. §365(b) of German application number 19915640.9, filed Apr. 7, 1999, German application number 19927529.7, filed Jun. 16, 1999, and German application number 19933703.9, filed Jul. 19, 1999.

FIELD OF THE INVENTION

The invention relates to a method and device for thin-film ablation of a substrate, for example, in this case for delamination of laminated ceramics or glasses. More particularly the invention is intended for surface layer ablation of a thin-film solar cell. In addition the invention relates to a method for encapsulating a thin-film solar module comprising a thin-film laminated substrate.

BACKGROUND OF THE INVENTION

Conventional solar modules of crystalline silicon are based on wafer fabrication with subsequent electrical wiring, resulting in relatively small power units of approximately 1 W, silicon wafers then needing, as a rule, to be circuited into 50–100 W modules.

As an alternative to these conventional solar modules thin-film solar cells have become known on the basis of micrometer film thicknesses. The substantial elements of a thin-film solar cell are shown in FIG. 2 and consist of a p/n junction between the absorber layer and the window layer.

Unlike conventional silicon wafer wiring, thin-film cells can have integrated circuitry. Following the individual coating steps on the total surface area, the back electrode, the sandwiched cell, and the front electrode are sliced into longitudinal strips. Staggering these three slices relative to each other forms an electrical connection between cells adjoining the front and back electrode. Slicing may be done by scribing or laser slicing, permitting cost-effective fabrication of a standard solar module for 12 V applications on a size of approximately 0.5×0.5 m$^2$, for example.

The useful life of such a solar module is substantially dictated by how well the thin-film layers are protected from the weather and environment. Achieving a long life of 30 years and more requires the thin-film layers to withstand extreme exposure to sunlight, moisture and air pollutants. The requirements as to moisture stability and voltage strength can thus only be satisfied when the thin-film solar cell is sufficiently encapsulated and the current-carrying components are adequately insulated electrically. For this purpose the current-carrying components of a thin-film solar cell are encapsulated and laminated. Encapsulation is achieved by coating the substrate with the current-carrying film layers, delaminating the surface portion of the substrate, and then depositing a laminate on the complete film-layer. This results in laminate and substrate being surface bonded and resistant to corrosion, thus reliably protecting internal portions from moisture degradation.

To make this clear, FIG. 1 is a diagrammatic representation of a section through an encapsulated solar cell, showing how patterned film-layers 3 deposited on the substrate 4 are delaminated in the surface areas 5 and encapsulated by a laminate layer 2. Deposited over the laminate layer 2 is a layer of window glass 1.

One problem in such an encapsulating of a thin-film solar cell is in delaminating the thin-film surface layers. Conventional methods of delamination, such as for instance sandblasting or delamination by grinding, unavoidably also result in damage to the substrate surface and in the formation of microcracks therein. The great differences in temperature in a thin-film module once in operation and the resulting tensile stresses add to the risk of fracture and ultimately to the solar cell being damaged due to cracks forming in the surface. Accordingly, surface delamination needs to be undertaken with particular care in a surface usually a few millimeters to centimeters wide.

Chemical methods of ablation are known in principle for machining solar cells which, however, have the drawback of lengthy machining times and involve complicated steps in machining.

This is why removing the surface areas as described continues to be done by mechanical methods such as grinding or sandblasting since these methods permit precisely defining material ablation. In addition to the damage done to the substrate surface and the formation of microcracks as already described, these methods have the additional drawback that the workpiece as a rule needs to be subsequently chemically cleaned in an ultrasonic bath since the plume of the ablated film-layers soils the module undesirably.

It is known to produce the steps as described above for forming integrated circuits for a thin-film solar module by a laser beam for interconnecting the resulting individual strips in series.

Known, for example, from U.S. Pat. No. 4,734,550 is a method for machining thin-film layers with a laser, one special application cited being machining photoelectric film-layers generated by thin-film technology. The objective of the machining method is to notch the thin-film layers by directing the machining beam on the surface of each workpiece so that the power distribution applied at the time remains as homogenous as possible. This is achieved by using a rectangularly focused beam having a flat intensity distribution. In addition, the beam is controlled and steered such that the overlapping portions of the rectangularly focused beam results in an intensity distribution as uniform as possible. This method is said to permit notching to a precise and even depth for series circuiting solar cells.

The objective of all methods for series circuiting solar cells is to attain a track width as narrow as possible for minimum electric power degradation of the solar module, track widths of the order of 50 μm being cited, for example, in U.S. Pat. No. 4,734,550.

Supplementary thereto, optimum power densities are cited in Nakano, S., et al., "Laser Patterning Method for Integrated Type a-Si Solar Cell Submodules, in: Jap. J. of Appl. Phys. Vol. 25, No. 12, 1986, pages 1936–1943 for laser beam machining of solar modules in obtaining series circuiting. In this case, power densities of the order of $1.10^6$ W/cm$^2$ are cited as being suitable for obtaining a track width of 50 μm.

Since, as aforementioned, the delamination methods for series circuiting has the objective of attaining a minimum track width, they are unsuitable for surface delamination of solar modules, since for this application surface strips a few millimeters wide need to be delaminated. This is why the aforementioned mechanical methods are used, now as then, despite the aforementioned drawbacks, for surface delamination.

U.S. Pat. No. 5,151,135 discloses a device for cleaning the surfaces of solar cells and other means, it comprises a laser resonator for generating a light pulse machining beam having a pulse duration smaller than 100 ns and a pulse energy density in the range of 0.1 J/cm$^2$ to 10J/cm$^2$, an optical system for imaging the machining beam generated by the laser resonator on the surface to be cleaned over a surface area in the range of 1 mm$^2$ to a few cm$^2$ with a substantially homogenous power distribution, a first positioner for a predefined relative movement between the surface to be cleaned and the machining beam, and including a controller for signaling the first positioner such that each unit of surface area is beamed with a substantially constant amount of energy.

Japanese Patent No. 10 052 780A discloses a device for tin-film ablation of a thin-film solar cell comprising a laser resonator for generating a light pulse machining beam, an optical system comprising a lens and a pin-hole diaphragm for imaging the machining beam generated by the laser resonator on the surface to be machined over a surface area in the range of a 1 mm$^2$ to cm$^2$ with a substantially homogenous power distribution, a first positioner for a predefined relative movement between the workpiece and the machining beam, and including a controller for signaling the first positioner such that each unit of surface area is beamed with a substantially constant amount of energy.

SUMMARY OF THE INVENTION

The invention is based on the object of providing a device and a method for thin-film ablation of a solar cell permitting cost-effective ablation of strips up to a few millimeters wide without damaging the substrate located beneath the layer to be ablated.

The invention is based on having discovered that, contrary to applications known hitherto, laser ablation can also be put to use, surprisingly, for obtaining ablation widths in the millimeter range. As compared to methods for series circuiting solar cells, the machining surface area of the laser beam is expanded via a suitable optical system, to a range of approximately 1 mm$^2$ up to 1 cm$^2$ (i.e. several magnitudes higher). Surprisingly, results have shown that even when expanding the machining beam to this extent, relatively thin-film delamination of a substrate is still possible when light pulses of the machining beam are generated with pulse durations smaller than 100 ns and a pulse energy density in the range 0.1 J/cm$^2$ to 10 J/cm$^2$. It appears to have been assumed that in such an expansion of the machining beam the irradiated energy can no longer be sufficiently absorbed. The ablation process is also still lacking a full explanation for the tracks widths used in series circuiting. It seems that the light pulses generate, in the topmost micrometers of the thin-film, a plasma whose expansion causes a shock wave. The heated material is thus subjected to a high internal pressure so that plasma particles are ejected from the irradiated site. In this respect it could not be anticipated that in expanding the machining beam several magnitudes larger similar good effects can still be attained when the remaining surface parameters are selected in suitable ranges. In addition, the power distribution in the machining beam is configured to be substantially homogenous. Although a Gaussian power distribution can usually be assumed for the machining beam, the invention teaches that the optical system needs to be configured so that an homogenous power distribution results in broad ranges over the surface area being machined. Otherwise no satisfactory ablation results could be achieved in expanding the machining beam in accordance with the invention.

To attain the ablation results in accordance with the invention it has furthermore been found out in the invention that the machining beam needs to be moved relative to the workpiece so that each unit of surface area of the workpiece to be ablated receives a substantially constant amount of energy.

With the device in accordance with the invention it is now possible to cost-effectively encapsulate a thin-film solar module comprising a substrate coated with thin-film layers. In this arrangement, the substrate is accordingly first coated over the full surface area with thin-film layers of the order of a few $\mu$m. Then, using the device in accordance with the invention, effective surface delamination of the substrate is done in a first step. In this arrangement, the first positioner is signaled such that the machining beam ablates from the substrate, slightly overlapping film strips in a reciprocating movement. As a rule, the cross-sectional width of the machining beam is still less than the width of the site to be actually ablated, so that signaling the first positioner in such a way also enables surface layers a few centimeters wide to be effectively ablated. In addition to a reciprocating movement of the machining beam, there is also the possibility of employing a quasi-rotative movement with which parallel, slightly overlapping film-layer strips can be ablated. Where a rectangular or square thin-film solar module is concerned, it is conceivable, for example, that the machining beam ablates in one cycle one film-layer strip at a time within the cross-sectional width of the machining beam. In this way, it is possible to delaminate larger areas without the first positioner needing to implement abrupt changes in speed.

Where the substrate in thin-film solar cells consists of a material transparent to the laser light of the machining beam, it has been discovered that delamination is possible not only at the film-layer side but also, to particular advantage, at the substrate side, consequently allowing the substrate to be delaminated with even more care. For this purpose, however, a special tooling table having suitable cutouts needs to be provided, to permit delamination of all desired sites.

For thin-film solar modules, partial delamination of patterned film-layers has been discovered to be a further application. The patterned film-layers usually consist of a front electrode, an absorber layer and a back electrode, the latter needing to be exposed in specific sites for contacting. After the back electrode has been exposed, it can then be contacted by metal bands. Since in this case the substrate must not be totally delaminated, this eliminates the possibility of machining the substrate side and thus delamination always needs to be done at the film-layer side.

In accordance with one preferred embodiment, a second positioner is provided for setting a constant machining angle between the optical axis of the machining beam and a perpendicular to each unit of surface area to be ablated. Exhaustive trial and error experiments have indicated that setting the machining angle in delaminating a thin-film solar module can have two effects. First, optimizing the speed and effectiveness of ablation is achieved by suitably setting the machining angle. Second, where the substrate is coated with several film-layers, it is in addition possible to attain a certain selectivity in ablating the film-layers by suitably setting the machining angle. More particularly, in the case of a thin-film configuration as shown in FIG. 2 a machining angle was found, by mechanisms which are still awaiting satisfactory explanation, for permitting ablation of the film-layer of the front electrode and absorber layer with no degradation of the back electrode.

To permit reproducible settings of the machining angle as established by trial and error, it is provided for in accordance with a preferred embodiment, to enable the second positioner to be likewise signaled by the controller, it more particularly being provided for that the controller comprises a memory and input unit. An optimum machining angle is memorized for each type of delamination process in the memory and on inputting a type of a delamination process into the input unit, the corresponding control signals for an optimum machining angle are communicated from the controller to the second positioner.

In exposing a back electrode of a thin-film solar cell it has been discovered that, preferably, an angle in excess of 0°, more particularly between 5° and 10°, needs to be selected. It is assumed that inclining the optical axis to the incidence perpendicular results in the film-layers located beneath the layer to be ablated having a lesser tendency to absorb the laser beams so that these film-layers remain totally free of degradation.

For total ablation of all film-layers it has been discovered to be good practice to select the so-called Brewster angle as the optimum machining angle, especially when the machining beam is suitably polarized, the tangent of the Brewster angle equaling the diffraction number of the layer to be ablated.

In accordance with another preferred embodiment, the light pulses are generated by modulating the pumping power. By modulating the pumping power for the active medium of a laser, the machining parameters in accordance with the invention can still be made available cost-effectively with pulse durations of just less than 100 ns. Shorter light pulses and higher power is achievable, however, by the Q modulation method. This enables light pulses to be made available of the order of 10 ns with sufficient power. For some applications, pulse durations of the order of 25 ns have also proven to be particularly of advantage. To achieve even shorter pulse times, recourse can be made to the so-called mode coupling method.

In accordance with yet another preferred embodiment, the machining beam for mode mixing is communicated via an optical fiber so that a power profile having approximately the shape of a truncated cone materializes for the power distribution. Mode mixing in the optical fiber translates the known Gaussian power profile into a trapezoidal or, as viewed three-dimensionally, truncated cone power profile.

In accordance with another preferred embodiment, the speed with which the relative movement advances, and the pulse repetition rate of the light pulses, are adapted so that a unit of surface area is no longer beamed by the machining beam as soon as the film-layer to be ablated has been removed. For example, the first positioner may be signaled such that the relative movement produces a traveling speed on the order of 1 cm/s for a pulse repetition frequency of the laser resonator of around 50 Hz.

It has been discovered to be particularly good practice to beam a unit of surface area substantially with a single light pulse or at least with only a few light pulses. The material of a unit of surface area to be ablated should thus be substantially "spalled" by a single light pulse with minimum degradation of the substrate underneath.

The wavelength of the laser resonator needs to be adapted to the film-layer to be ablated such that the light pulses are substantially absorbed thereby and not absorbed by the substrate material. In delaminating thin-film solar cells, good results have been obtained, for example, with a Nd:YAG-type laser resonator having wavelength of 1.064 $\mu$m.

In yet another preferred embodiment, a suction exhaust device for exhausting resulting dusts and vapors is provided that protects personnel from the dust and vapors and, for example, avoids deposits thereof on the workpiece which could degrade the surface quality of the film-layer to be exposed.

In a final preferred embodiment, the first positioner consists of means for mechanically steering the machining beam, together with the optical system, over the workpiece. In this case the workpiece accordingly remains stationary whilst the optical means is movably steered. For this purpose, the machining beam is communicated via an optical fiber cable. As an alternative, it is, however, conceivable that the first positioner consists of adjustable deviating mirrors via which the machining beam is steered to the workpiece. The deviating mirror assembly may include, for example, two deviating mirrors, the axes of rotation of which are located perpendicular to each other so that the machining beam can be simply moved over a larger plane. In addition, it is also possible to keep the optical system stationary whilst the workpiece is guided, for example, on an xy table, relative to the fixed machining beam. In conclusion, combinations of the aforementioned systems are conceivable in which both the machining beam and the workpiece are movably guided.

In addition to being used for delamination of thin-film solar cells, the device in accordance with the invention may, of course, be put to use for the delamination of all thin-film coated glasses or ceramics. One application may be modern insulated window glazing. So-called "k glasses" comprise additional vacuum deposited layers to reduce the transparency of the glazing to thermal radiation. Typical insulated glazing comprises at least two panes bonded in a frame profile into a dual pane so that, here too, surface delamination is needed. A wealth of delamination processes are likewise involved in all aspects of display systems.

In conclusion, further applications come into consideration in which coated glazing needs to be further processed, one example of which are so-called "switchable windows" which change their transparency to light on application of an electrical field.

BRIEF DESCRIPTION OF THE DRAWINGS

The invention will now be detailed by way of various exemplary embodiments with reference to the attached drawings in which.

DETAILED DESCRIPTION

Figure 1:
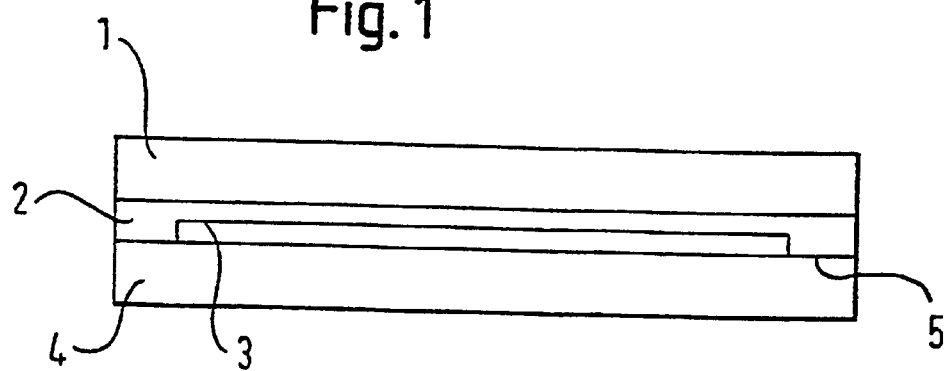
FIG. 1 is a cross-section through an encapsulated thin-film solar cell.

Referring now to FIG. 1, there is illustrated a cross-section through an encapsulated thin-film solar cell. The solar cell substantially consists of a substrate 4, the film-layers 3 deposited and patterned thereon, a laminate layer 2 and a layer of window glass applied thereto. The current-carrying film-layers 3 have a thickness in the range 0.1 to 5 $\mu$m and the substrate 4 is preferably made of float glass. To eliminate current paths to the current-carrying film-layers 3 and moisture degradation of the film-layers themselves, the surface region 5 of the substrate 4 must not contain any current-carrying layers. This is why the surface region 5 is delaminated in accordance with the invention.

Figure 2:
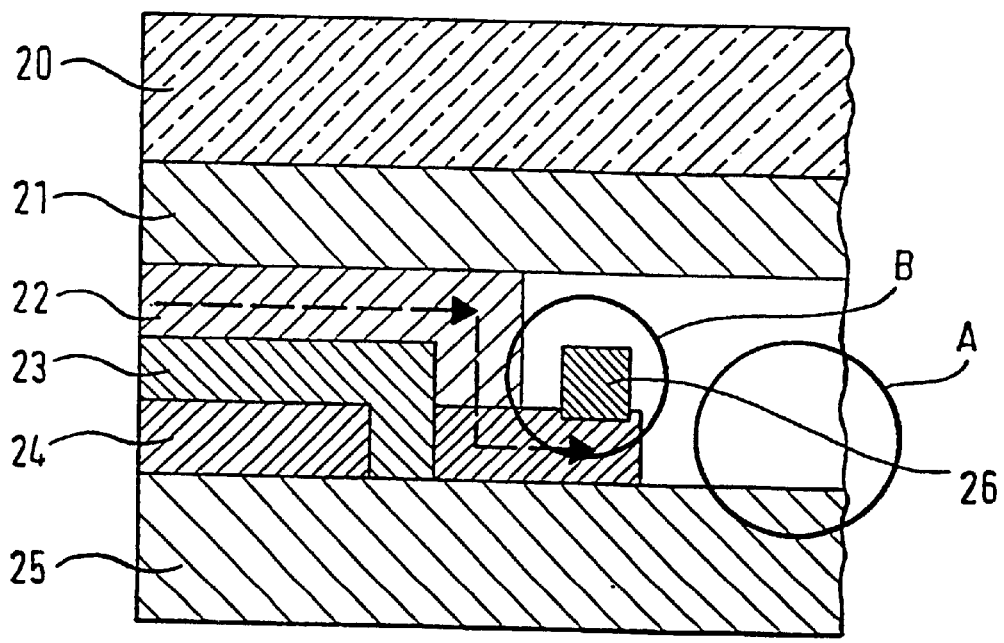
FIG. 2 is a cross-section through an encapsulated thin-film solar cell showing the film-layer sequence and contacting of the back electrode.

Referring now to FIG. 2, there is illustrated a cross-section through an encapsulated thin-film solar cell showing the film-layer sequence and contacting of the back electrode. In substrate thin-film solar cells, the film-layer sequence is made up of the back electrode 24, the absorber layer 23 and the front electrode 22. The film-layers are deposited on the substrate 25 and protected at the front electrode 22 side by the laminate 21. The laminate 21 is closed off by a layer 20 of window glass.

Marked in FIG. 2 are two sites A and B representing the various results of possible delamination processes in the case of a thin-film solar cell.

In site A, a complete delamination of the substrate has been undertaken with no degradation of the remaining surface of the substrate itself. In site B, a selective delamination of the front electrode and absorber layer has been undertaken so that the back electrode is left standing. For contacting the back electrode the film-layers thereabove need to be selectively removed without any substantial degradation of the back electrode itself. The exposed sites are then contacted with metal bands 26.

When removing the film-layers above the sites to be contacted, the light needs to be incident at the film-layer side of the front electrode 22.

For assessing the quality of the delamination process, metal bands were applied to the exposed back electrode sites using a current standard contacting process. The good bond of the bands showed that the delamination in accordance with the invention with a laser device is also suitable for exposing the sites of the back electrode to be contacted, thus replacing mechanical delamination also in the case of exposing the back electrode.

Figure 3:
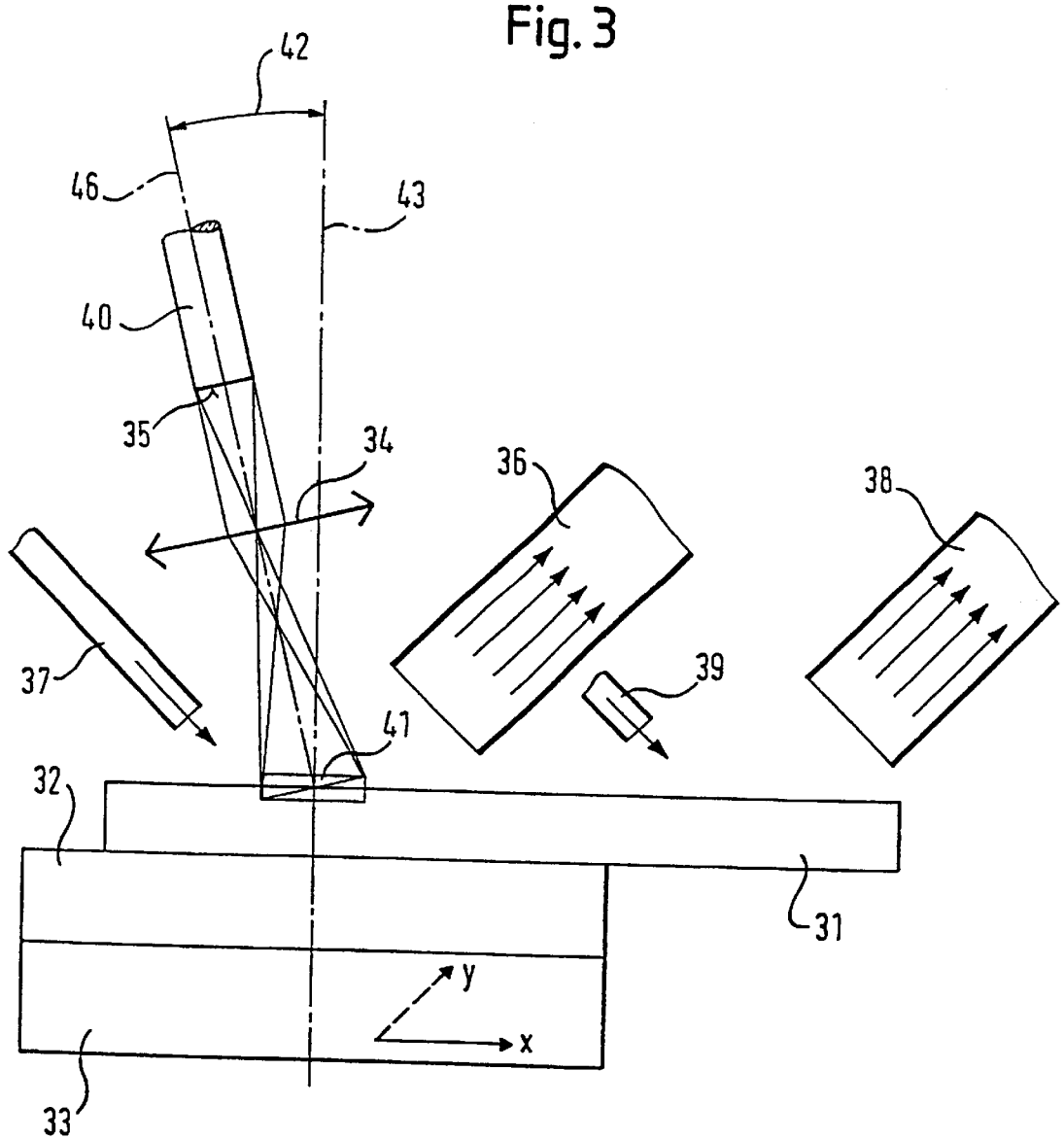
FIG. 3 is a diagrammatic representation of a first embodiment of a device for delaminating solar cells.

Referring now to FIG. 3, there is illustrated a first embodiment of a device for delaminating solar cells. Delamination was done with a pulsed ND:YAG-type laser. Preferably, the laser resonator is operated by the Q modulation method with a pulse duration on the order of 25 ns. The machining beam is communicated with the aid of an optical fiber cable 40 to an imaging optical system including a focussing lens 34. The output 35 of the optical fiber cable 40 is imaged via the focussing lens 34 on the workpiece 31 in the machining site 41.

In this configuration, the pulse energy density at the workpiece materializes from the pulse energy of the laser, the optical losses and the imaging scale of the optical system employed. The necessary pulse energy density, as well as the speed at which the laser beam is traveled relative to the workpiece to be delaminated, for a given power distribution depends on the laminate to be removed. For example, the laminates of thin-film solar modules tested permitted removal with pulse energy densities of the order of 1 J/cm$^2$ with a traveling speed of the order of 1 cm/s and a pulse frequency of 50 Hz.

In delaminating the back electrode as shown in FIG. 2, the necessary pulse energy density as well as the speed at which the laser beam is traveled relative to the workpiece to be delaminated for a given pulse frequency, likewise depends on the laminate involved. Successful delamination of the back electrode of thin-film solar modules was achieved, for example, with pulse energy densities of the order of 1 J/cm$^2$ with a traveling speed of the order of 3 cm/s and a pulse frequency of 50 Hz.

Evident from FIG. 3 is how the workpiece 31 is mounted by a corresponding tool holder 32 which may be, for example, a vacuum clamping bench. The tool holder 32 is in turn mounted on a CNC xy table 33. The table 33, including the tool holder 32 and the workpiece 31, can be traveled at constant speed so that the machining site 41 for delaminating the solar cell 31 is movable along a defined distance. Resulting vapors and dusts are exhausted via suction exhaust devices 36, 38. For special applications, nozzles 37, 39 are provided to protect the surface to be exposed from oxidation or other chemical reactions with the atmosphere. In this case, particularly nitrogen proved to be a suitable inert gas. The nozzles 37, 39 are set so that, at the machining site, an even flow of the inert gas over the surface of the workpiece is ensured.

Optimum machining results are attained when the optical axis 46 of the imaging optics is set to a machining angle to be defined as optimum for the particular application relative to the incidence perpendicular 43. Tilt angles in the range 5° to 10° have proved to be particularly favorable in the case of exposing a back electrode of a thin-film solar cell.

Figure 4:
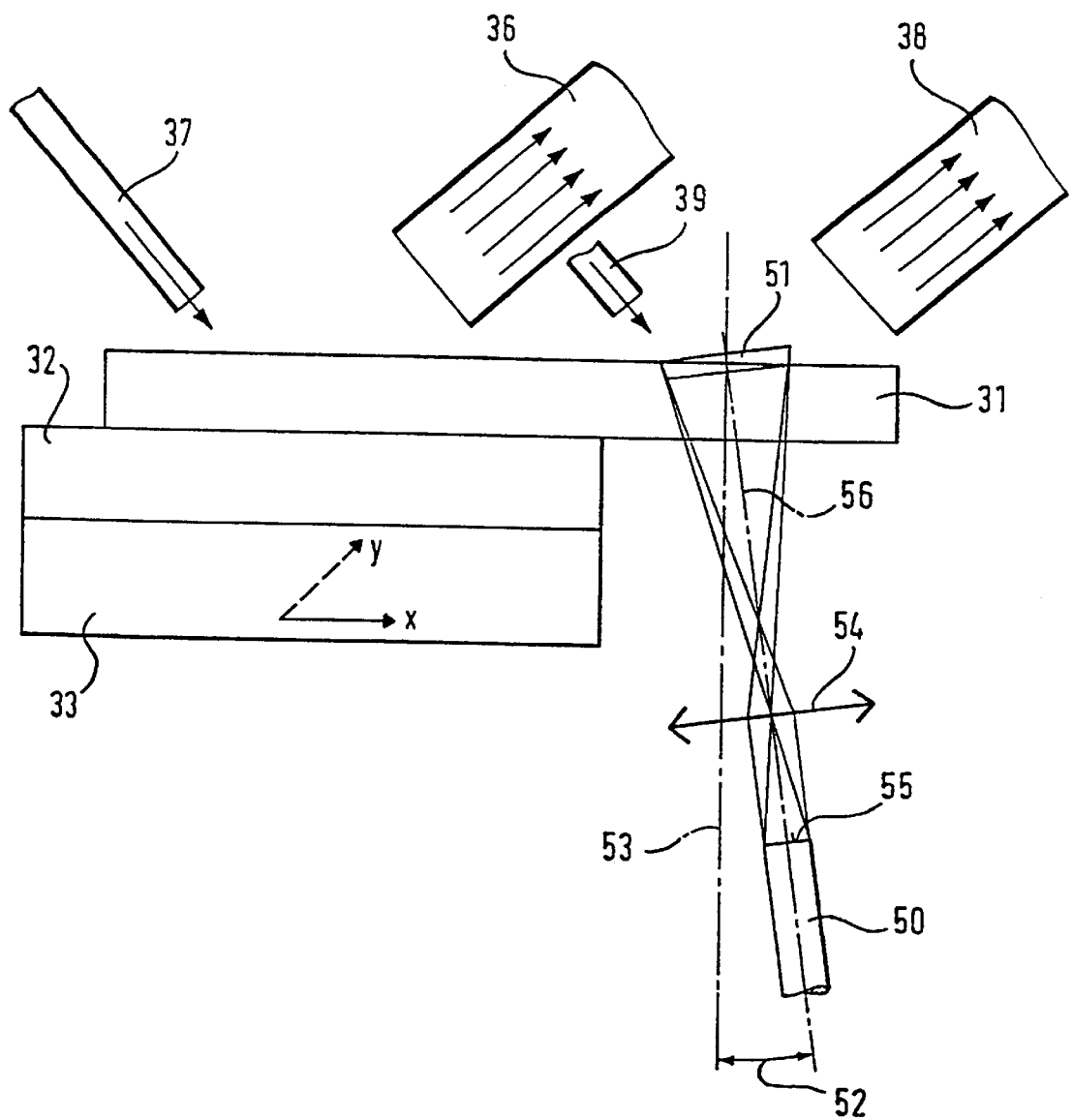
FIG. 4 is a diagrammatic representation of a second embodiment of a device for delaminating solar cells.

Referring now to FIG. 4, there is illustrated a second embodiment for delaminating solar cells. The mounting configuration of the solar cell 31 from the first embodiment was retained, it being identified by the same reference numerals. The substantial difference of the second embodiment, as shown in FIG. 4 compared to the first embodiment is that delamination as shown in FIG. 4 is in the region of the bottom substrate layer.

This application comes into consideration in all processes for delaminating solar cells involving a light-transparent substrate which needs to be totally exposed in defined areas. Whilst fine hair cracks materialized in the delaminated site with light incidence at the coated side, the glass substrate with light incidence at the substrate side permitted delamination with no degradation of the substrate evident under an optical microscope.

Otherwise the optical configuration is the same as that of the first embodiment so that, likewise, the machining beam is communicated via a optical fiber cable 50 to an imaging optical system including a focussing lens 54 which, in turn, images the output portion 55 of the optical fiber cable 50 on the workpiece 31 in the machining site 51.

In the delamination method in accordance with the second embodiment, good results were attained, for example, when the machining angle of the optical axis 56 was set to the incidence perpendicular.

In the second embodiment too, dusts and vapors generated during lasering are exhausted. Subsequent cleaning is necessary neither for the substrate side variant nor for the laminate side variant, in applying the delamination methods as employed hitherto. Both variants of the novel laser delamination system are thus preferable over existing mechanical systems.

It is to be noted, in particular regarding the second embodiment as shown in FIG. 4, however, that fully machining the solar cell at the substrate side may require corresponding cutouts to be provided in the xy table 33 and tool holder 32 so that the machining beam is unobstructed in attaining all sites of the solar cell to be delaminated.

More particularly, for products in which even the finest of microcracks in the substrate could pose a problem, the variant having light incidence at the substrate side should be employed. In less critical applications, regarding microcracks in the substrate or where other substrate types are concerned—delamination with the simpler arrangement for mounting the workpiece is possible, with light incidence at the coated side. It is also particularly advantageous when the methods in accordance with these embodiments can be suitably combined. Thus, for example, the fracture-sensitive surface sites of the substrate can be delaminated in accordance with the second embodiment at the substrate side, since these surface sites have facilitated access, thus eliminating the need for cutouts in the tool holder and in the clamping table, whereas delamination in accordance with the first embodiment can be done at the coated side where central sites require delamination in special applications.

Having thus described various illustrative embodiments, variations and modifications may be apparent to one of skill in the art. Such variations and modifications are intended to be included in this disclosure. The scope of the invention should be determined from proper construction of the appended claims, and their equivalents.

What is claimed is:

1. A device for ablating at least one thin-film layer selected from the group including a front electrode, an absorber layer and a back electrode of a substrate of a workpiece, comprising:

a laser resonator for generating a light pulse machining beam having pulse durations smaller than 100 ns and a pulse energy density in a range 0.1 J/cm$^2$ to 10 J/cm$^2$;

an optical system arranged in a path of the machining beam, the optical system including a mode-mixing optical fiber cable and an optical imaging member for imaging an output of the optical fiber cable on a surface of the workpiece to be machined, wherein the optical system produces, in a plane of the surface to be machined, a power distribution in a surface area range of 1 mm$^2$ to 1 cm$^2$ that is substantially homogenous; and a positioner, controllable by a controller, for positioning the workpiece relative to the machining beam such that for a relative movement an amount of energy impinging the surface to be machined is substantially constant for each unit of surface area.

2. The device as claimed in claim 1, wherein the workpiece is a thin film solar cell.

3. The device as claimed in claim 1, wherein the laser resonator generates the light pulse machining beam by modulating a pumping power of the laser resonator.

4. The device as claimed in claim 1, wherein the laser resonator generates the light pulse machining beam by Q modulation.

5. The device as claimed in claim 1, wherein the pulse durations are approximately 25 ns.

6. The device as claimed in claim 1, wherein a relative advancing speed of the positioner is approximately 1 cm/s, and light pulses of the light pulse machining beam are generated by the laser resonator with a pulse repetition frequency of approximately 50 Hz.

7. The device as claimed in claim 1, wherein a relative advancing speed of the positioner and a pulse repetition frequency of light pulses in the machining beam are set such that a unit of surface area of the surface of the workpiece to be machined is beamed by a single or few light pulses.

8. The device as claimed in claim 1, wherein a wavelength of the machining beam generated by the laser resonator is such that the machining beam is substantially absorbed by a film-layer of the workpiece to be ablated and is substantially not absorbed by the substrate of the workpiece.

9. The device as claimed in claim 8, wherein the laser resonator is a ND:YAG-type laser resonator having a wavelength of 1.064 μm.

10. The device as claimed in claim 1, wherein the optical imaging member is variably adjustable for changing an angle of its optical axis relative to the plane of the surface of the workpiece to be machined.

11. The device as claimed in claim 1, wherein a suction exhaust means is provided in a vicinity of an effective site of the machining beam.

12. The device as claimed in claim 1, wherein a nozzle means for supplying an inert gas is provided in a vicinity of an effective site of the machining beam.

13. A method for ablating at least one thin-film layer selected from the group including a front electrode, an absorber layer and a back electrode of a substrate of a workpiece, comprising acts of:

generating a light pulse machining beam having pulse durations smaller than 100 ns and a pulse energy density in a range 0.1 J/cm$^2$ to 10 J/cm$^2$, communicating the machining beam via a mode-mixing optical fiber cable; imaging an output of the optical fiber cable on a surface of the workpiece to be machined such that, in a plane of a surface to be machined, power distribution in a surface area range of 1 mm$^2$ to 1 cm$^2$ is substantially homogenous; and positioning the workpiece relative to the machining beam such that for a relative movement, an amount of energy impinging the surface to be machined is substantially constant for each unit of surface area.

14. The method as claimed in claim 13, wherein the workpiece is a thin-film solar cell.

15. The method as claimed in claim 13, wherein generating the light pulse machining beam includes modulating a pumping power of a laser resonator that generates the light pulse machining beam.

16. The method as claimed in claim 13, wherein generating the light pulse machining beam includes generating light pulses by Q modulation.

17. The method as claimed in claim 13, wherein generating the light pulse machining beam includes generating light pulses having a pulse duration of approximately 25 ns.

18. The method as claimed in claim 13, wherein:

positioning the workpiece includes advancing the workpiece relative to the machining beam at a speed of approximately 1 cm/s; and generating the light pulse machining beam includes generating light pulses with a pulse repetition frequency of approximately 50 Hz.

19. The method as claimed in claim 13, further including an act of setting a relative speed between the workpiece and the machining beam and a pulse repetition frequency in the machining beam such that a unit of surface area of the workpiece surface to be machined is beamed by a single or few light pulses.

20. The method as claimed in claim 13, wherein generating the machining beam includes generating a machining beam having a wavelength such that the machining beam is substantially absorbed by a film-layer of the workpiece to be ablated and is substantially not absorbed by the substrate of the workpiece.

21. The method as claimed in claim 20, wherein generating the light pulse machining beam includes generating the light pulse machining beam with a ND:YAG-type laser resonator having a wavelength of 1.064 μm.

22. The method as claimed in claim 13, further including variably adjusting an angle of the machining beam relative to the plane of the surface of the workpiece to be machined.

23. The method as claimed in claim 13, wherein the workpiece comprises a substrate, further comprising:

coating the substrate with at least one thin film-layer; and covering the at least one thin-film layer with a laminate that encapsulates the substrate, thereby forming a solar cell.

* * * * *